(12) United States Patent
Sandow et al.

(10) Patent No.: US 11,869,985 B2
(45) Date of Patent: Jan. 9, 2024

(54) DIODE INCLUDING A PLURALITY OF TRENCHES

(71) Applicant: Infineon Technologies Austria AG, Villach (AT)

(72) Inventors: Christian Philipp Sandow, Haar (DE); Matteo Dainese, Munich (DE); Viktoryia Lapidus, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/389,479

(22) Filed: Jul. 30, 2021

(65) Prior Publication Data

US 2022/0045221 A1    Feb. 10, 2022

(30) Foreign Application Priority Data

Aug. 5, 2020    (DE) .......................... 102020120680.1

(51) Int. Cl.
*H01L 29/861*    (2006.01)
*H01L 27/07*    (2006.01)

(52) U.S. Cl.
CPC ...... *H01L 29/8613* (2013.01); *H01L 27/0727* (2013.01)

(58) Field of Classification Search
CPC ............. H01L 29/7804; H01L 29/7805; H01L 29/407; H01L 29/8616; H01L 29/861
See application file for complete search history.

(56) References Cited

U.S. PATENT DOCUMENTS

| 2007/0040213 | A1* | 2/2007 | Hotta | ................... H01L 29/7813 |
|---|---|---|---|---|
| | | | | 257/E29.066 |
| 2020/0083369 | A1 | 3/2020 | Kobayashi et al. | |
| 2020/0098747 | A1* | 3/2020 | Tamura | ................. H01L 29/868 |

* cited by examiner

*Primary Examiner* — Jesse Y Miyoshi
(74) *Attorney, Agent, or Firm* — Murphy, Bilak & Homiller, PLLC

(57) ABSTRACT

A diode is proposed. The diode includes a semiconductor body having a first main surface and a second main surface opposite to the first main surface. The diode further includes an anode region and a cathode region. The anode region is arranged between the first main surface and the cathode region. An anode pad area is electrically connected to the anode region. The diode further includes a plurality of trenches extending into the semiconductor body from the first main surface. A first group of the plurality of trenches includes a first trench electrode. A second group of the plurality of trenches includes a second trench electrode. The first trench electrode is electrically coupled to the anode pad area via an anode wiring line and the second trench electrode.

10 Claims, 5 Drawing Sheets

DIODE INCLUDING A PLURALITY OF TRENCHES

TECHNICAL FIELD

The present disclosure is related to a diode, in particular to semiconductor devices including the diode.

BACKGROUND

Diodes are a key device element in integrated circuits (ICs). For example, during half-bridge turn-off of a semiconductor switch, a so-called freewheeling diode takes over the current. In order to enter a low resistive forward conducting mode, the freewheeling diode is required to bring its junction into forward bias and reduce the built-in blocking electric field. During this process, the freewheeling diode is not yet flooded with charge carriers causing a large voltage drop when forced to conduct significant current. As conductance increases while charge carriers are stored in the diode, this voltage drop reduces. The phenomenon is characterized by the so-called forward recovery voltage. In circuit applications, the forward recovery voltage is a key parameter since a parallel switching device, e.g. an insulated gate bipolar transistor (IGBT), is required to have enough reverse blocking capability to withstand this voltage peak. Moreover, a gate driver, which may drive the gate of the parallel switching device, can be damaged if the forward recovery voltage becomes too large. Different types of diodes have different levels of forward recovery voltage. This may depend on thickness, base-material-resistivity, anode efficiency and other factors. In case of a diode including trenches charging of parasitic trench-related capacitances may cause a pro-longed forward recovery phase with larger amplitude of the forward recovery voltage.

There is a need to reduce the forward recovery voltage of diodes including trenches.

SUMMARY

An example of the present disclosure relates to a diode. The diode includes a semiconductor body having a first main surface and a second main surface opposite to the first main surface. The diode further includes an anode region and a cathode region. The anode region is arranged between the first main surface and the cathode region. An anode pad area is electrically connected to the anode region. The diode further includes a plurality of trenches extending into the semiconductor body from the first main surface. A first group of the plurality of trenches includes a first trench electrode. A second group of the plurality of trenches includes a second trench electrode. The first trench electrode is electrically coupled to the anode pad area via an anode wiring line and the second trench electrode.

Another example of a diode according to the present disclosure includes a semiconductor body having a first main surface and a second main surface opposite to the first main surface. The diode further includes an anode region and a cathode region. The anode region is arranged between the first main surface and the cathode region. An anode pad area is electrically connected to the anode region. The diode further includes a plurality of trenches extending into the semiconductor body from the first main surface. A first group of the plurality of trenches includes a first trench electrode. The first trench electrode is subdivided into at least a first part and a second part. A conductance per unit length of the first part along a longitudinal direction of the first trench electrode is by at least a factor of 1000 smaller than a conductance per unit length of the second part along the longitudinal direction of the first trench electrode. The second part is electrically coupled to the anode pad area via the first part.

Another example of a diode according to the present disclosure includes a semiconductor body having a first main surface and a second main surface opposite to the first main surface. The diode further includes an anode region and a cathode region. The anode region is arranged between the first main surface and the cathode region. An anode pad area is electrically connected to the anode region. The diode further includes a plurality of trenches extending into the semiconductor body from the first main surface. A first group of the plurality of trenches includes a first trench electrode. The first trench electrode is electrically coupled to the anode pad area via an anode wiring line and a resistor.

Another example of a diode according to the present disclosure includes a semiconductor body having a first main surface and a second main surface opposite to the first main surface. The diode includes an anode region and a cathode region. The anode region is arranged between the first main surface and the cathode region. An anode pad area is electrically connected to the anode region. The diode further includes a plurality of trenches extending into the semiconductor body from the first main surface. A first group of the plurality of trenches includes a first trench electrode. At least one resistive element is coupled in series between the first trench electrode of each trench of the plurality of trenches and the anode pad area. The diode is configured to conduct current in an on-state in a forward direction and to block current in an off-state, wherein the diode is configured to switch from the off-state to the on-state during a switching time, wherein the at least one resistive element is configured such that a potential of each first trench electrode of the plurality of trenches is deviating from a potential of the anode pad area during the switching time by at least 2V for at least 30% of the switching time.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

DETAILED DESCRIPTION

Figure 1A:
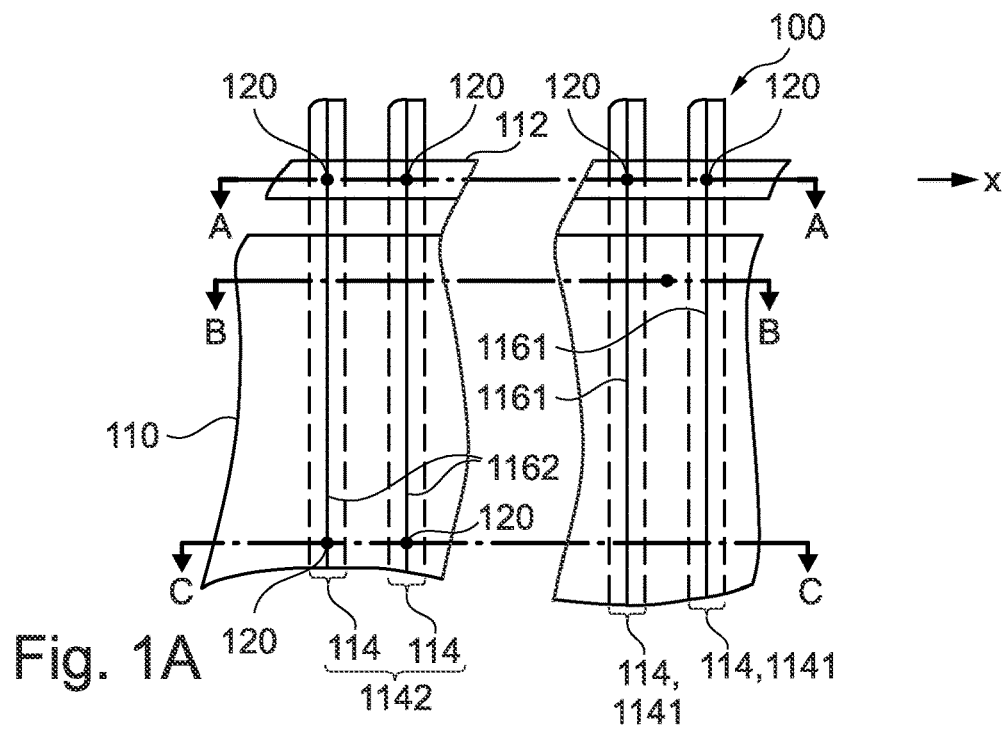
FIGS. 1A to 1E are schematic plan and cross-sectional views for illustrating an example of a diode including a resistive coupling between a trench electrode and an anode pad area.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may be a permanent electrical connection between elements, for example a permanent direct-current contact between the respective elements or a low-resistive connection via a metal and/or heavily doped semiconductor material. The term "electrically coupled" may include that one or more intervening control or resistive element(s) adapted for signal and/or power transmission may be arranged between the electrically coupled elements, for example, elements such as switches which are controllable to temporarily provide an electrical connection in a first state and a high-resistive electric decoupling in a second state, or resistors. Electrically coupled elements may also be electrically connected, for example. An ohmic contact is a non-rectifying electrical junction with a substantial linear current-voltage characteristic.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a diode may include a semiconductor body having a first main surface and a second main surface opposite to the first main surface. The semiconductor body may include an anode region and a cathode region. The anode region may be arranged between the first main surface and the cathode region. An anode pad area may be electrically connected to the anode region. A plurality of trenches may extend into the semiconductor body from the first main surface. A first group of the plurality of trenches may include a first trench electrode. A second group of the plurality of trenches may include a second trench electrode. The first trench electrode may be electrically coupled to the anode pad area via an anode wiring line and the second trench electrode. In a top view, the plurality of trenches may be formed within the diode area. The plurality of trenches may be directly surrounded by semiconductor regions forming the p-n-diode.

The diode may be a vertical diode device having a current flow between a first terminal, e.g. an anode terminal, at the first main surface and a second terminal, e.g. a cathode terminal, at a second main surface opposite to the first main surface. The diode may be a freewheeling diode. The freewheeling diode may be part of a semiconductor switching circuit, e.g. a half-bridge. The diode may be configured to conduct currents of more than 1 A or more than 10 A or even more than 30 A and may be further configured to block voltages between anode and cathode terminals in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the diode, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first main surface may be a level at an interface between the semiconductor body and a wiring area above the semiconductor body at a first side of the semiconductor body. Likewise, the second main surface may be a level at an interface between the semiconductor body and a wiring area, e.g. rear side contact, above the semiconductor body at a second side of the semiconductor body.

The anode region may include one or a plurality of anode sub-regions merged with one another. The anode region may have a first conductivity type, e.g. p-type. The anode sub-regions may differ, at least partly, from one another with respect to one or more of, doping concentration profile, doping concentration species, vertical and/or lateral extension. For example the anode region or the anode sub-regions may be formed by a diffusion and/or ion implantation process, for example. For example, the anode region may include a $p^+$-doped anode contact region adjacent to the first main surface and one or more p-doped anode sub-regions extending along the vertical direction deeper into the semiconductor body than the anode contact region, for example.

The cathode region may include one or a plurality of cathode sub-regions merged with one another. The cathode region may have a second conductivity type, e.g. n-type. The cathode sub-regions may differ, at least partly, from one another with respect to one or more of, doping concentration profile, doping concentration species, vertical and/or lateral extension. For example the cathode region or the cathode sub-regions may be formed by a diffusion and/or ion implantation process, for example. For example, the cathode region may include an $n^-$-doped drift region, an n-doped field stop region and an $n^+$-doped cathode contact region adjacent to the second main surface. An impurity concentration in the drift region may gradually or in steps increase or decrease with increasing distance to the first main surface at least in portions of its vertical extension. According to other examples the impurity concentration in the drift region may be approximately uniform. For diodes based on silicon, a mean impurity concentration in the drift region may be between $5 \times 10^{12}$ cm$^{-3}$ and $1 \times 10^{15}$ cm$^{-3}$, for example in a range from $1 \times 10^{13}$ cm$^{-3}$ to $2 \times 10^{14}$ cm$^{-3}$. In the case of diodes based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements of the diode, e.g. a specified voltage class. When operating the diode in voltage blocking mode, a space charge region may vertically extend partly or totally through the drift region depending on the blocking voltage applied to the diode. When operating the diode at or close to the specified maximum blocking voltage, the space charge region may reach or penetrate into the field stop region. The field stop region is configured to prevent the space charge region from further reaching to the cathode terminal at the second main surface of the semiconductor body. In this manner, the drift region may be formed using desired low doping levels and with a desired thickness while achieving soft switching for the diode thus formed.

A pn-junction may be formed between the anode region and the cathode region.

The anode pad area may be part of one wiring level of a wiring area above the first main surface. The wiring area may include one or more than one wiring levels, e.g. two, three, four or even more wiring levels. Each wiring level may be formed by a single one or a stack of conductive layers, e.g. metal layer(s) or doped layers, e.g. highly doped semiconductor layers such as highly doped polycrystalline silicon. The wiring levels may be lithographically patterned, for example. Between stacked wiring levels, an intermediate dielectric may be arranged. One or more contact plugs or contact lines may be formed in openings of the intermediate dielectric to electrically connect parts, e.g. metal lines or contact areas or pads, of different wiring levels to one another. In case of multiple wiring levels, the anode pad area may be located furthest away from the first main surface, e.g. in an outermost wiring level with respect to the first main surface. For example, the anode pad area may be arranged above the anode region. Contacts, e.g. plugs and/or contact lines may conduct a diode current along the vertical direction between the anode pad area and the anode region in the semiconductor body, for example.

For example, all or some parts of each of the plurality of trenches of the first and second group may be stripe-shaped. Stripe-shaped parts of the trenches of the first and second group may extend in parallel along a longitudinal direction. For example, the trench electrode in each of the first group and second group of the plurality of trenches may be electrically insulated from a surrounding part of the semiconductor body, e.g. from the anode region, by a trench dielectric. The trench dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. The trench electrode in each of the first group and second group of the plurality of trenches may include one electrode material or a combination of electrode materials, for example a doped semiconductor material (e.g. a highly doped semiconductor material) such as doped polycrystalline silicon, metal or metal compounds. The plurality of trenches of the first group and the second group may, at least partly, be concurrently formed, e.g. by common etch process(es). Likewise, also the trench electrode and/or the trench dielectric of the first group and the second group may, at least partly, be concurrently formed, e.g. by common layer deposition process(es). The electrodes in the plurality of trenches may act as field-plates configured to protect the anode from high electric field strengths that may limit diode switching ruggedness and prevent a further lowering of the anode efficiency, for example.

Other than in an active area of IGBTs or MOSFETs (metal oxide semiconductor field effect transistors) where n-doped and p-doped regions, e.g. source and body, are electrically connected to a load terminal via the first main surface, the anode pad area may be electrically connected to a semiconductor region of one conductivity type only, e.g. the anode region. The active area may be an area at the first main surface of the diode where a load current can flow through the first main surface between the semiconductor body and the wiring area, for example. The diode may include areas at the first main surface that differ from the active area, e.g. an edge termination area that partly or fully surrounds the active area. Since pn-junctions within the semiconductor body, e.g. the pn-junction between the cathode region and the anode region, may terminate at edge zones of the semiconductor body, this edge effect may limit the device breakdown voltage below the ideal value that is set by the parallel plane junction.

The anode wiring line may be arranged at or close to an edge of the active area. For example, the anode wiring line may be laterally spaced from the anode pad area. Although the first trench electrode in the first group of the trenches may at least in part be arranged directly below the anode pad area, the first trench electrode is electrically coupled to the anode pad area via the anode wiring line and the second trench electrode instead of being directly electrically connected to the anode pad area by a contact above the first trench electrode. This provides a resistive coupling of the first trench electrode to the anode pad such that a higher ohmic resistance is provided between the first trench electrode and the anode pad compared to a direct connection of the first trench electrode. Thus, the current from the first trench electrode is forced to flow along a longitudinal extension of the second trench electrode thereby increasing the resistance. Resistively coupling the first trench electrode to the anode pad area may allow for improving a tradeoff between diode ruggedness and forward recovery voltage by limiting a displacement current flow to the first trench electrodes. This may counteract a charging of the parasitic capacitance of the trenches, and thus, to reduce a prolongation of the forward recovery phase. Apart from resistively coupling the first trench electrodes to the anode pad area via a second trench electrode, other measures for resistive coupling may be applied as will be described in examples below, e.g. resistive coupling via a resistor, e.g. a polycrystalline silicon resistor, in the wiring area above the semiconductor body, resistive coupling via a resistor on a substrate different from the semiconductor body, resistive coupling via a resistor implemented by narrowing a cross-section of the trench electrode in the trenches, for example.

For example, the anode wiring line and the anode pad area may be separate parts of a patterned wiring layer. For example, the anode wiring line and the anode pad area may correspond to one wiring level of the wiring area above the first main surface.

For example, a ratio between a number of trenches in the first group and a number of trenches in the second group may range from 100 to 100,000. The ratio may allow for adjusting a voltage drop of a resistor causing the resistive coupling between the first trench electrode and the anode pad area, for example. In some embodiments, a longitudinal extension of the first trench electrode and the second trench electrode may have approximately the same value.

For example, the anode wiring line may laterally surround at least a quarter or half of a circumference of the anode pad area. For this example, some or all of the trenches of the first group may be electrically connected to the anode wiring line at one end of the trenches. Reducing the degree of circulation of the anode pad area by the anode wiring line may allow for implementing an area efficient resistive coupling between the anode pad area and the first trench electrode, for example.

For example, the second trench electrodes may be connected in parallel between the anode wiring line and the anode pad area. A total resistance of the second trench electrodes connected in parallel multiplied by the total capacitance of the first trench electrodes is in a range between 100 Ohm×nF and 100 Ohm×µF. The total capacitance may depend on the permittivity of the oxide material, the thickness of the insulating dielectric material (e.g. oxide material) of the trenches and the overall area of the insulating dielectric material opposing the semiconductor material and the trench electrodes. In some embodiments, the total capacitance may be calculated according to the plate capacitance formula $C=\varepsilon A/d$, wherein $\varepsilon$ is the permittivity of the material of the insulating dielectric layer, A is the overall area of the insulating dielectric material opposing on one side the semiconductor material and on the other the trench electrodes and d is the thickness of the insulating dielectric layer.

For example, a conductance per unit length of the second trench electrode along a longitudinal direction of the plurality of trenches may be smaller than a conductance per unit length of the first trench electrode along the longitudinal direction of the plurality of trenches. For example, a material of the second trench electrode may have a larger electrical resistivity than a material of the first trench electrode. For example, material or material combinations of the first trench electrode and the second trench electrode may differ. As an alternative or in addition, a same semiconductor material may be used for the first trench electrode and the second trench electrode, e.g. polycrystalline silicon, but a doping concentration of the semiconductor material of the first trench electrode may be larger than a doping concentration of the semiconductor material of the second trench electrode. As an alternative or in addition, a cross-sectional area of the second trench electrode, perpendicular to the longitudinal direction of the trenches, may at least partly, e.g. in at least some segments of the second trench electrode along the longitudinal direction, be smaller than a cross-sectional area of the first trench electrode.

Another example of a diode may include a semiconductor body having a first main surface and a second main surface opposite to the first main surface. The diode may include an anode region and a cathode region. The anode region may be arranged between the first main surface and the cathode region. An anode pad area may be electrically connected to the anode region. The diode may include a plurality of trenches extending into the semiconductor body from the first main surface. A first group of the plurality of trenches may include a first trench electrode. The first trench electrode may be subdivided into at least a first part and a second part. A conductance per unit length of the first part along a longitudinal direction of the first trench electrode may be by a factor of at least 1000 smaller than a conductance per unit length of the second part along the longitudinal direction of the first trench electrode. The second part is electrically coupled (e.g. DC-connected) to the anode pad area via the first part.

Similar to the second trench electrode in the trenches of the second group described in the above examples, the second part of the first trench electrode may allow for a resistive coupling between the first part of the first trench electrode and the anode pad area.

For example, a material of the first part of the first trench electrode may have a larger electrical resistivity than a material of the second part of the first trench electrode. For example, a material or material combinations of the first part of the first trench electrode and the second part of the first trench electrode may differ. As an alternative or in addition, a semiconductor material may be used for the first part of the first trench electrode and for the second part of the first trench electrode, e.g. polycrystalline silicon, but a net doping concentration of the semiconductor material of the first part of the first trench electrode may be smaller than a net doping concentration of the semiconductor material of the second part of the first trench electrode. As an alternative or in addition, a cross-sectional area of the first part of the first trench electrode perpendicular to the longitudinal direction of the trenches may at least partly be smaller than a cross-sectional area of the second part of the first trench electrode. The smaller cross-sectional area in the first part may be obtained due to a smaller lateral and/or vertical extent (width and/or height) in at least one segment of the first part of the first trench electrode compared to the second part of the first trench electrode.

For example, a lateral extent of the first part along the longitudinal direction of the first trench electrode may be smaller than a lateral extent of the second part along the longitudinal direction of the first trench electrode.

Another example of a diode may include a semiconductor body having a first main surface and a second main surface opposite to the first main surface. The diode may further include an anode region and a cathode region. The anode region may be arranged between the first main surface and the cathode region. An anode pad area may be electrically connected to the anode region. A plurality of trenches may extend into the semiconductor body from the first main surface. A first group of the plurality of trenches may include a first trench electrode. The first trench electrode may be electrically coupled to the anode pad area via an anode wiring line and a resistor.

For example, the resistor may be arranged on a substrate different from the semiconductor body. For example, the substrate may be a printed circuit board or another chip. The diode in the semiconductor body and the resistor on the substrate may be electrically connected by any suitable connection technique, e.g. bond wires, solder balls, plug and socket contacts.

For example, the anode wiring line may merge into an auxiliary anode pad area over the semiconductor body, and a first bond wire electrically may connect auxiliary anode pad area and a first end of the resistor on the substrate.

For example, the resistor may be arranged in a wiring area over the first main surface. For example, the resistor may be formed in a first wiring level over the first main surface, e.g. a wiring level closest to the first main surface. The resistor may be formed by polycrystalline silicon.

For example, a third group of the plurality of trenches may include a third trench electrode. The third trench electrode may be electrically connected to the anode pad area via a contact arranged in a part of the first main surface where the third trench electrode and the anode pad area overlap one another.

Other than the first trench electrode of the first group which is resistively coupled to the anode pad area, the third trench electrode in the trenches of the third group may be electrically connected to the anode pad area by contacts arranged between the anode pad area and the third trench electrode. This may allow for a low-resistive connection of the third trench electrode to the anode pad area such that a lower ohmic connection is provided between the third trench electrode and the anode pad area compared to the higher resistive connection of the first trench electrode to the anode pad area. Provision of the third trench electrode may allow for protecting the anode from high electric field strengths that may limit diode switching ruggedness, for example.

For example, the plurality of trenches may extend into the anode region, or may extend through the anode region and into the cathode region, e.g. a drift region of the cathode region.

Another example of a diode may include a semiconductor body having a first main surface and a second main surface opposite to the first main surface. The diode may include an anode region and a cathode region. The anode region may be arranged between the first main surface and the cathode region. An anode pad area may be electrically connected to the anode region. A plurality of trenches may extend into the semiconductor body from the first main surface. A first group of the plurality of trenches may include a first trench electrode. At least one resistive element may be electrically coupled in series between the first trench electrode of each trench of the plurality of trenches and the anode pad area. The diode is configured to conduct current in an on-state in a forward direction and to block current in an off-state. The diode is further configured to switch from the off-state to the on-state during a switching time, wherein the at least one resistive element is configured such that a potential of each first trench electrode of the plurality of trenches is deviating from a potential of the anode pad area during the switching time by at least 2V for at least 30% of the switching time. Providing the resistive element for a trench diode as described above allows an effective improvement of a tradeoff between diode ruggedness and forward recovery voltage by limiting a displacement current flow to the first trench electrodes. This may counteract a charging of the parasitic capacitance of the trenches, and thus, to reduce a prolongation of the forward recovery phase.

The switching time can be determined by a time interval between the steady off-state and the steady on-state of the diode.

For example, the at least one resistive element is configured such that the potential of each first trench electrode of the plurality of trenches is deviating from the potential of the anode pad area during the switching by not more than 15 V for at least 30% of the switching time.

For example, the at least one resistive element may be configured such that the potential of each first trench electrode of the plurality of trenches is deviating from the potential of the anode pad area after a time interval of 5 μs from switching by not more than 200 mV.

A resistivity of a resistor for resistively coupling the trench electrode to the anode pad area may range from 1 Ohm to 1 kOhm, for example.

Another example of the present disclosure relates to a semiconductor device. The semiconductor device includes the diode as described in the examples above or further below. The semiconductor device further includes a power transistor such as a reverse conducting insulated gate bipolar transistor, RC-IGBT. The diode and the RC-IGBT may be electrically connected in parallel. For example, the cathode region of the diode and the emitter of the RC-IGBT may be electrically connected. Likewise, the anode region of the diode and the collector of the RC-IGBT may be electrically connected. A transistor cell array of the RC-IGBT may at least partly surround the diode according to one example.

For example, the anode pad area of the diode and a source contact area of the RC-IGBT merge with one another. For example, the anode pad area of the diode and the source contact area may be formed by a continuous pad area of a wiring level, e.g. an outermost wiring level, of a wiring area. One or more bond wires may be formed on the continuous pad area. The continuous pad area may at least partly cover an active area of the diode and an active area of the RC-IGBT.

The examples and features described above and below may be combined.

In the following, further examples of semiconductor devices are explained in connection with the accompanying drawings. Functional and structural details described with respect to the examples above shall likewise apply to the exemplary embodiments illustrated in the figures and described further below.

Figure 1B:
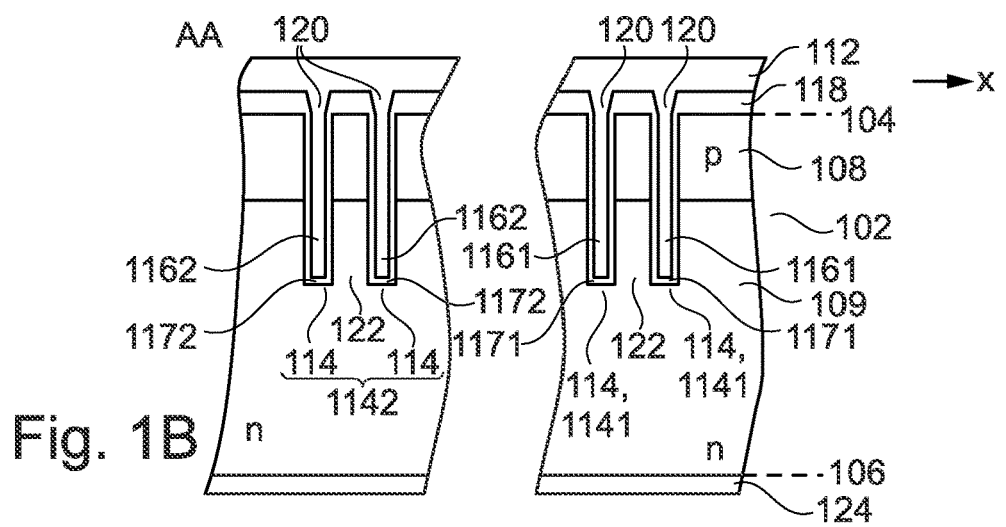
Figure 1C:
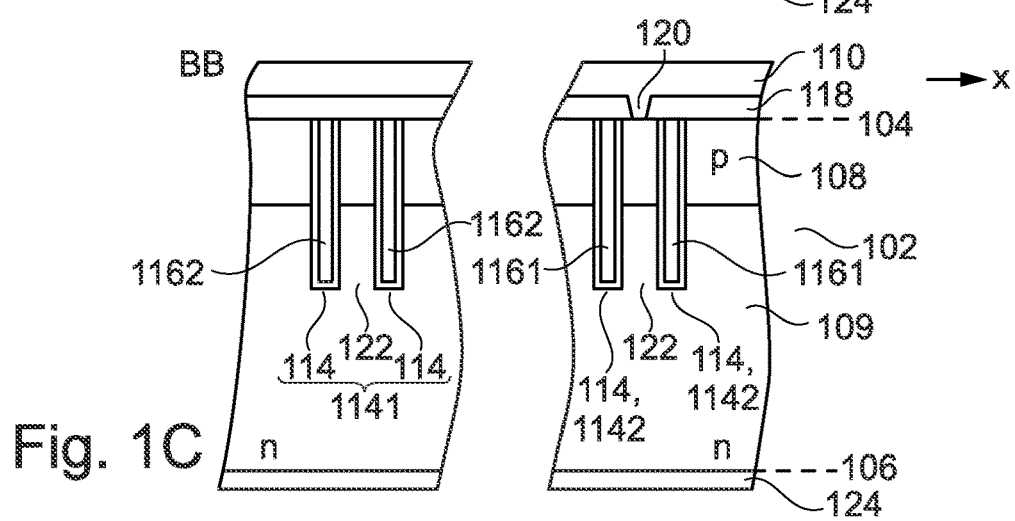
Figure 1D:
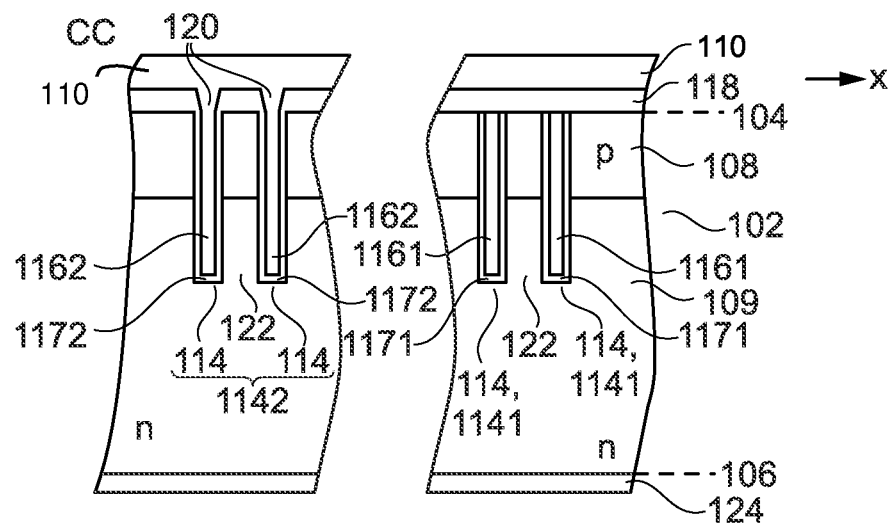

FIG. 1A is a schematic plan view illustrating an example of a diode 100. FIG. 1B is a schematic cross-sectional view along intersection line AA of FIG. 1A. FIG. 1C is a schematic cross-sectional view along intersection line BB of FIG. 1A. FIG. 1D is a schematic cross-sectional view along intersection line CC of FIG. 1A.

Referring to the schematic views of FIGS. 1A to 1D, the diode 100 includes a plurality of trenches 114 extending from a first main surface 104 into a semiconductor body 102. A first group 1141 of the plurality of trenches 114 includes a first trench electrode 1161. A second group 1142 of the plurality of trenches 114 includes a second trench electrode 1162. In a plan view, the first group 1141 of the plurality of trenches and the second group 1142 of the plurality of trenches may be located within an area of the diode. Between the first group 1142 of the plurality of trenches and the second group 1142 of the plurality of trenches other trenches may be arranged. Trench dielectrics 1171, 1172 electrically separate the trench electrodes 1161, 1162 from a surrounding part of the semiconductor body 102.

The first trench electrode 1161 is electrically coupled to an anode pad area 110, e.g. an anode terminal of a vertical diode such as a freewheeling diode, via an anode wiring line 112 and the second trench electrode 1162. The anode wiring line 112 and the second trench electrode 1162 are electrically connected in series between the anode pad area 110 and the first trench electrode 1161. In the figures, contacts 120 provide an electric contact between regions of the semiconductor body 104 and a first wiring level and/or an electric contact between electrodes in the trenches 114 and the first wiring level. The first wiring level may include for example the anode wiring line 112 or the anode pad area 110. An intermediate dielectric 118 is arranged between the first wiring level and the semiconductor body 104. The contacts 120 may correspond to a conductive filling within holes of the intermediate dielectric 118. For example, the contacts 120 may be contact plugs or contact lines.

The diode 100 further includes an anode region 108 and a cathode region 109. Mesa regions 122 are each confined along a lateral direction x by neighboring two of the trenches 114. In the examples illustrated in FIGS. 1A to 1D, the anode region 108 is formed in the mesa regions 122. In some embodiments a part of the cathode region 109 may also be formed in the mesa regions 122. According to other examples, the anode region 108 may extend up to or below a bottom side of the mesa regions 122. Apart from the trenches 114 illustrated in the schematic views of FIGS. 1A to 1D, additional trenches may be arranged, e.g. between the trenches 114 of the first group 1141 and the trenches 114 of the second group 1142. The cathode region 109 is electrically connected to a cathode terminal 124, e.g. a metal layer or metal layer stack, at a second main surface 106 of the semiconductor body 102.

As is schematically illustrated in the cross-sectional view of FIG. 1C, the anode region 108 in the mesa region 122 may be electrically connected to the anode pad area 110 via contact 120.

As is schematically illustrated in the cross-sectional view of FIG. 1D in combination with the cross-sectional view of FIG. 1B, the first trench electrode 1161 is electrically coupled to the anode pad area 110 via the anode wiring line 112 and the second trench electrode 1162. Contacts 120 formed between the first trench electrodes 1161 and the anode wiring line 112 provide a current from the first trench electrode 1161 to the anode wiring line 112. Furthermore, contacts between the second trench electrodes 1162 and the anode wiring line 112 provide this current from the anode wiring line 112 to the second trench electrodes 1162. Contacts formed between the second trench electrodes 1162 and the anode pad area 110 provides this current to the anode pad area 110. This provides a resistive coupling of the first trench electrode 1161 to the anode pad area 110 such that a higher ohmic resistance is provided between the first trench electrode 1161 and the anode pad area 110 compared to a direct connection of the first trench electrode 1161. Thus, the current from the first trench electrode 1161 is forced to flow along a longitudinal extension of the second trench electrode 1162, see e.g. the longitudinal extension between the contacts 120 from the anode wiring line 112 to the second trench electrode 1162 in FIG. 1B and the contacts 120 from the second trench electrode 1162 to the anode pad area 110 in FIG. 1D. Furthermore, a resistance of the electrical connection of the anode pad area 110 via the contacts 120 to the anode area 108 is lower than a resistance of the electrical connection of the anode pad area to the first trench electrodes 1161.

Figure 1E:
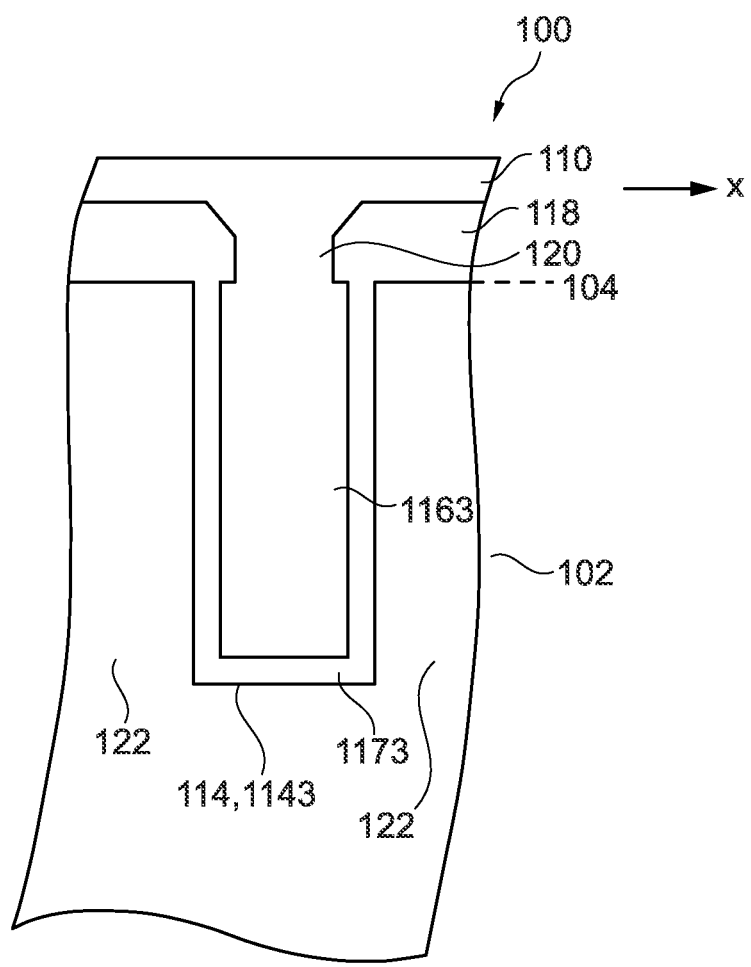

Referring to the schematic cross-sectional view of FIG. 1E, the diode 100 may further include, e.g. between the trenches 114 of the first group 1141 and the trenches 114 of the second group 1142 illustrated in FIG. 1C, a third group 1143 of the plurality of trenches 114. Trenches 114 of the third group 1143 include a third trench electrode 1163 and a trench dielectric 1173. Other than the first trench electrodes 1161 of the first group 1141 of the trenches 114 which are resistively coupled to the anode pad area 110 by the second trench electrodes 1162 of the second group 1142 of the trenches 114 (see e.g. FIG. 1A), the third trench electrode 1163 in the trenches 114 of the third group 1143 are electrically connected to the anode pad area 110 by contacts 120 arranged between the anode pad area 110 and the third trench electrode 1163. This allows for a low-resistive connection of the third trench electrode 1163 to the anode pad area 110 such that a lower ohmic connection is provided between the third trench electrode 1163 and the anode pad area 110 compared to the higher resistive connection of the first trench electrode 1161 to the anode pad area 110. Provision of the third trench electrode 1163 may allow for protecting the anode from high electric field strengths that may limit diode switching ruggedness, for example.

Various layouts of the trenches 114 may be implemented in an active area of the diode 100.

For example, mesa regions 122 may be confined along the lateral direction x by a trench 114 of the first group 1141 of trenches 114 and any one of a trench 114 of the second group 1142, or of the third group 1143. Likewise, mesa regions 122 may be confined along the lateral direction x by a trench 114 of the second group 1142 of trenches 114 and any one of a trench 114 of the first group 1141, or of the third group 1143.

Figure 2A:
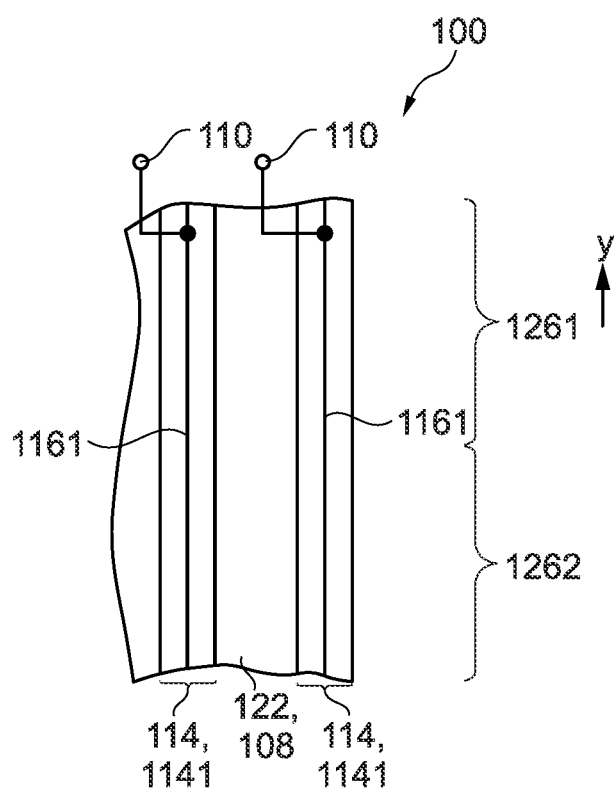
FIGS. 2A to 2C, 3 and 4 are schematic plan and cross-sectional views for illustrating other examples of a diode including a resistive coupling between a trench electrode and an anode pad area.
Figure 2B:
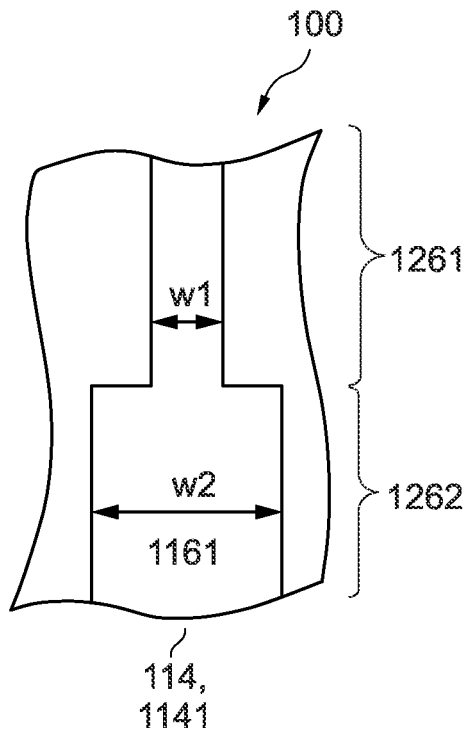
Figure 2C:
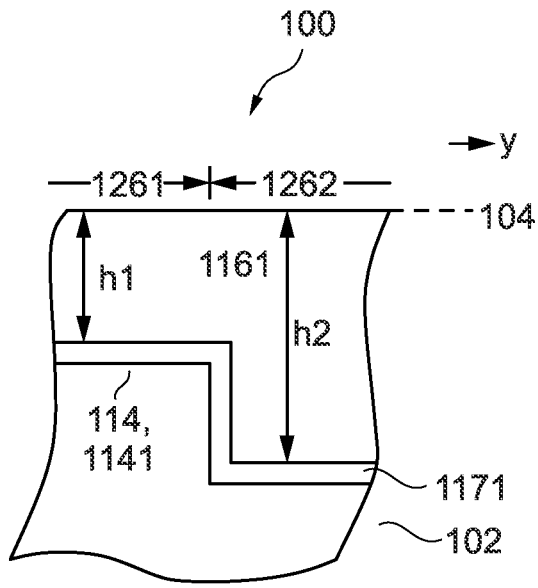

A further example of a diode 100 is illustrated in the schematic plan views of FIG. 2A, 2B and the schematic cross-sectional view of FIG. 2C.

Similar to the previous examples, the diode 100 includes a plurality of trenches 114 extending into a semiconductor body 102 from a first main surface 104, wherein a first group 1141 of the plurality of trenches 114 includes a first trench electrode 1161.

The first trench electrode 1161 is subdivided into at least a first part 1261 and a second part 1262. A conductance per unit length of the first part 1261 along a longitudinal direction y of the first trench electrode 1161 is lower than a conductance per unit length of the second part 1262 along the longitudinal direction y of the first trench electrode 1161.

The second part 1262 of the first trench electrode 1161 is electrically coupled to the anode pad area 110 via the first part 1261. In the schematic view of FIG. 2A, the anode pad area 110 is schematically illustrated by a terminal. The first part 1261 may be electrically connected to an anode wiring line a contact, or may be directly connected to the anode pad area by a contact, for example.

The diode 100 further includes an anode region 108 in a mesa region 122 bounded by trenches 114 of the first group 1141.

Referring to the schematic plan view of FIG. 2B, a width w1 of the first trench electrode 1161 at the first main surface 104 in the first part 1261 is smaller than a width w2 in the second part 1262. This allows for a decrease of a conductance per unit length of the first trench electrode 1161 in the first part 1261 along the longitudinal direction y compared with the second part 1262.

In addition or as an alternative to the example of FIG. 2B, the schematic cross-sectional view of FIG. 2C, which is taken along the longitudinal direction y of the first trench electrode 1161, is one example of a diode having a vertical extent h1 of the first trench electrode 1161 in the first part 1261 that is smaller than a vertical extent h2 in the second part 1262 by forming the trench 114 of the second group 1142 in the first part 1261 more shallow than in the second part 1262.

Figure 3:
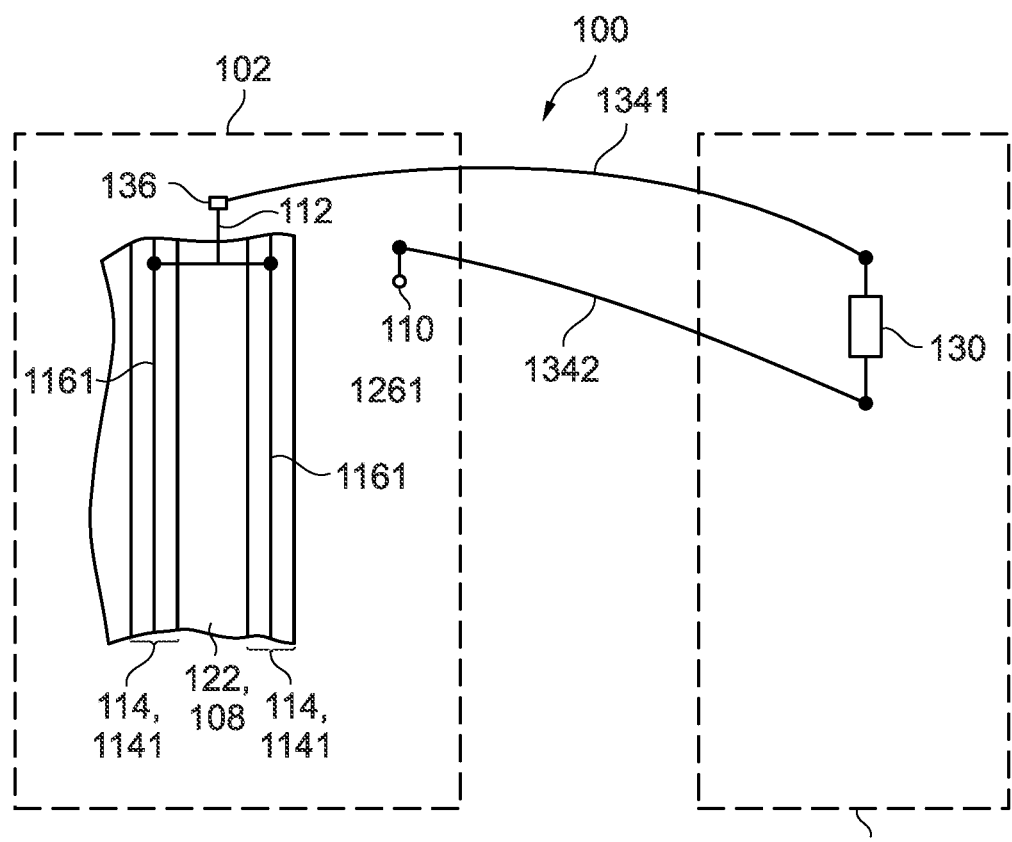

Another example of a diode 100 is illustrated in the schematic plan views of FIG. 3.

Similar to the previous examples, the diode 100 includes a first group 1141 of trenches 114 that includes a first trench electrode 1161.

The first trench electrode 1161 is electrically coupled to an anode pad area 110 via an anode wiring line 112 and a resistor 130 placed on a substrate 132 different from the semiconductor body 104. The anode wiring line 112 and the resistor 130 are connected in series between the anode pad area 110 and the first trench electrode 1161. Bond wires 1341, 1342 may provide an electric connection between an auxiliary anode pad area 136 in the wiring area of the semiconductor body 102 and the substrate 132. However, other interconnection technique, e.g. solder bonds or through silicon vias may be used.

Figure 4:
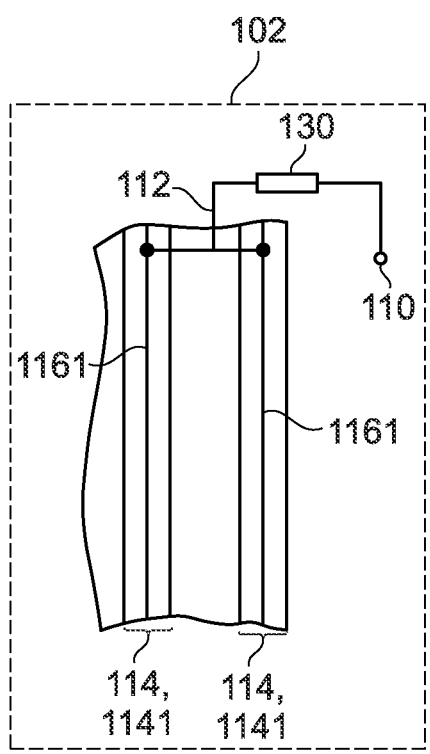

Another example of a diode 100 is illustrated in the schematic plan view of FIG. 4.

Instead of placing the resistor 130 on a substrate 132 different from the semiconductor body 102, the resistor 130 of the diode 100 in FIG. 4 is part of the diode 100 and can be arranged, for example, in the wiring area of diode 100. For example, the resistor 100 may be implemented as a polycrystalline silicon resistor.

Figure 5:
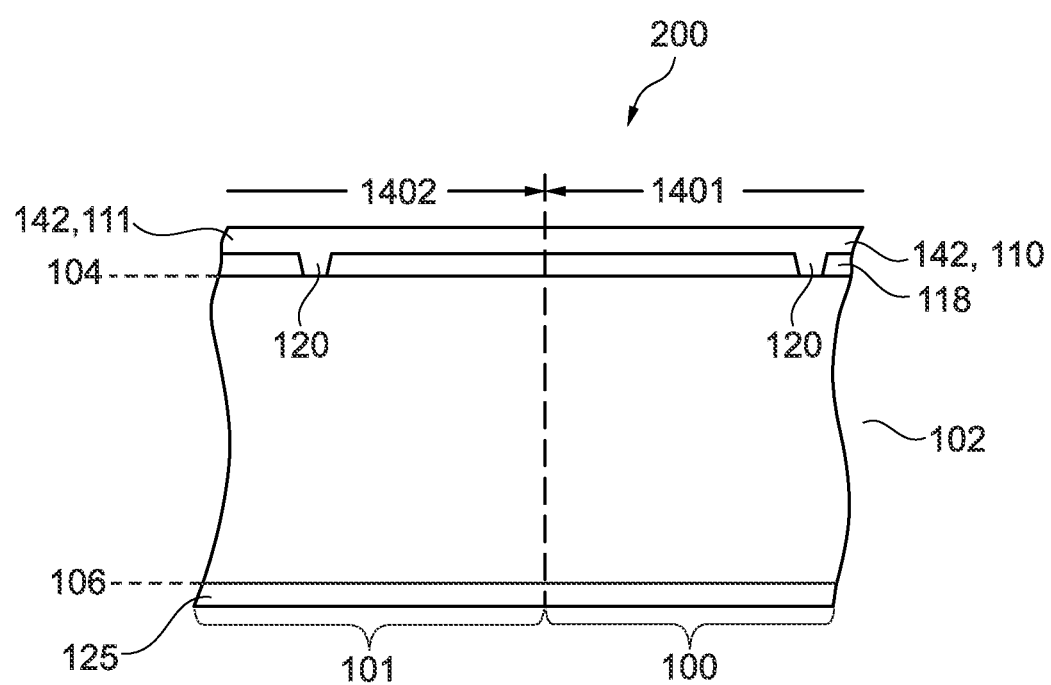
FIG. 5 is a schematic cross-sectional view illustrating a semiconductor device including a diode and a switching device connected in parallel.

An example of a semiconductor device 200 is illustrated in the schematic cross-sectional view of FIG. 5.

The semiconductor device 200 includes the diode 100 in a first part 1401 of the semiconductor body 102. Structural elements of the diode 100 may correspond to any of the structural elements or any combination of structural elements described with reference to the diodes 100 in the examples above. The structural elements of the diode 100 in the semiconductor body 102 are not illustrated in the schematic view of FIG. 5. The semiconductor device 200 further includes a switching device 101, e.g. a reverse conducting insulated gate bipolar transistor, RC-IGBT, in a second part 1402 of the semiconductor body 102. Structural elements of the switching device 101 in the semiconductor body 102 are not illustrated in the schematic view of FIG. 5.

The pad area 110 of the diode 100 and a load contact area 111 of the switching device 101 may be connected and form a common pad area 142. The common pad area 142 is electrically connected to active areas of the diode 100 and of the switching device 101 by contacts 120. The diode 100 and the RC-IGBT 101 may be electrically connected in parallel between the common pad area 142 at the first main surface 104 and a load terminal 125, e.g. metal layer or metal layer stack, at the second main surface 106.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A diode, comprising:
a semiconductor body having a first main surface and a second main surface opposite to the first main surface;
an anode region and a cathode region, wherein the anode region is arranged between the first main surface and the cathode region;
an anode pad area electrically connected to the anode region; and
a plurality of trenches extending into the semiconductor body from the first main surface,
wherein a first group of the plurality of trenches includes a first trench electrode and a second group of the plurality of trenches includes a second trench electrode,
wherein the first trench electrode is electrically coupled to the anode pad area via an anode wiring line and the second trench electrode so as to form an electrical current path between the first trench electrode and the anode pad area that must pass through the second trench electrode.

2. The diode of claim 1, wherein the anode wiring line and the anode pad area are separate parts of a patterned wiring layer.

3. The diode of claim 1, wherein a ratio between a number of trenches in the first group and a number of trenches in the second group ranges from 100 to 100,000.

4. The diode of claim 1, wherein the anode wiring line laterally surrounds at least a quarter of a circumference of the anode pad area.

5. The diode of claim 1, wherein the second trench electrodes are connected in parallel between the anode wiring line and the anode pad area, and wherein a total resistance of the second group of trench electrodes connected in parallel multiplied by the total capacitance of the first group of trench electrodes is in a range between 100 Ohm×nF and 100 Ohm×µF.

6. The diode of claim 1, wherein a conductance per unit length of the second trench electrode along a longitudinal direction of the plurality of trenches is smaller than a conductance per unit length of the first trench electrode along the longitudinal direction of the plurality of trenches.

7. A semiconductor device, comprising:
the diode of claim 1; and
a reverse conducting insulated gate bipolar transistor, RC-IGBT,
wherein the diode and the RC-IGBT are electrically connected in parallel.

8. The semiconductor device of claim 7, wherein the anode pad area of the diode and a source contact area of the RC-IGBT merge with one another.

9. The diode of claim 1, wherein a resistance of the electrical connection of the anode pad area to the anode region is lower than a resistance of the electrical connection of the anode pad area to the first trench electrode.

10. The diode of claim 1, wherein at least part of a cross-sectional area of the second trench electrode, perpendicular to the longitudinal direction of the plurality of trenches, is smaller than a cross-sectional area of the first trench electrode.

* * * * *